(12) United States Patent
Van der Schaar et al.

(10) Patent No.: US 8,111,398 B2
(45) Date of Patent: Feb. 7, 2012

(54) METHOD OF MEASUREMENT, AN INSPECTION APPARATUS AND A LITHOGRAPHIC APPARATUS

(75) Inventors: Maurits Van der Schaar, Eindhoven (NL); Arie Jeffrey Den Boef, Waalre (NL); Everhardus Cornelis Mos, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/770,153

(22) Filed: Apr. 29, 2010

(65) Prior Publication Data

US 2010/0277706 A1    Nov. 4, 2010

Related U.S. Application Data

(63) Continuation of application No. 11/641,124, filed on Dec. 19, 2006, now abandoned, and a continuation-in-part of application No. 10/918,742, filed on Aug. 16, 2004, now Pat. No. 7,791,727, and a continuation-in-part of application No. 11/203,418, filed on Aug. 15, 2005, now Pat. No. 7,791,732.

(51) Int. Cl.
*G01B 11/00* (2006.01)
*G03C 5/00* (2006.01)
(52) U.S. Cl. ............................. 356/399; 356/401; 430/30
(58) Field of Classification Search ......................... None
See application file for complete search history.

(56) References Cited

U.S. PATENT DOCUMENTS

| | | | |
|---|---|---|---|
| 3,909,602 A | 9/1975 | Micka | |
| 4,538,914 A | 9/1985 | Yomoda et al. | |
| 4,672,196 A | 6/1987 | Canino | |
| 4,999,014 A | 3/1991 | Gold et al. | |
| 5,042,951 A | 8/1991 | Gold et al. | |
| 5,106,196 A | 4/1992 | Brierley | |
| 5,153,669 A | 10/1992 | DeGroot | |
| 5,166,752 A | 11/1992 | Spanier et al. | |
| 5,192,980 A | 3/1993 | Dixon et al. | |
| 5,218,415 A | 6/1993 | Kawashima | |
| 5,349,440 A | 9/1994 | DeGroot | |
| 5,412,473 A | 5/1995 | Rosencwaig et al. | |

(Continued)

FOREIGN PATENT DOCUMENTS

EP     0 396 409 B1     11/1990

(Continued)

OTHER PUBLICATIONS

Non-Final Rejection mailed Feb. 9, 2007 for related U.S. Appl. No. 10/918,742 (now U.S. Patent No. 7,791,727), filed Aug. 16, 2004; 30 pages.

(Continued)

*Primary Examiner* — Gordon Stock, Jr.
(74) *Attorney, Agent, or Firm* — Sterne, Kessler, Goldstein & Fox P.L.L.C

(57) ABSTRACT

According to an example, a first layer of a substrate comprises a plurality of gratings having a periodicity P. A second layer of the substrate comprises a plurality of gratings, overlapping with the first set of gratings, and having a periodicity of NP, where N is an integer greater than 2. A first set of gratings has a bias of +d and the second set of gratings has a bias of −d. A beam of radiation is projected onto the gratings and the angle resolved spectrum of the reflected radiation detected. The overlay error is then calculated using the angle resolved spectrum of the reflected radiation.

21 Claims, 3 Drawing Sheets

U.S. PATENT DOCUMENTS

Figure 1A:
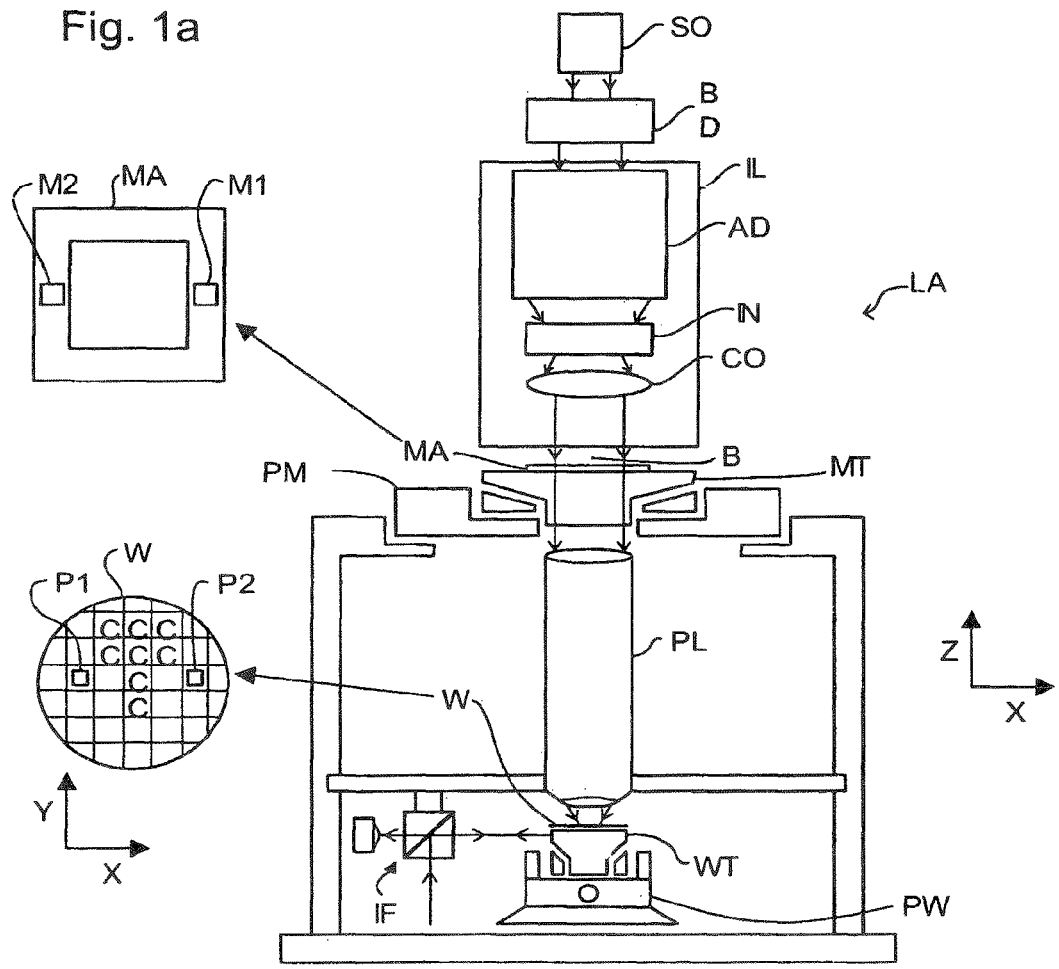

| | | | |
|---|---|---|---|
| 5,541,731 A | 7/1996 | Freedenberg et al. | |
| 5,596,411 A | 1/1997 | Fanton et al. | |
| 5,703,692 A | 12/1997 | McNeil et al. | |
| 5,713,364 A | 2/1998 | DeBaryshe et al. | |
| 5,747,813 A | 5/1998 | Norton et al. | |
| 5,771,094 A | 6/1998 | Carter et al. | |
| 5,877,859 A | 3/1999 | Aspnes et al. | |
| 5,880,838 A | 3/1999 | Marx et al. | |
| 5,910,842 A | 6/1999 | Piwonka-Corle et al. | |
| 5,963,329 A | 10/1999 | Conrad et al. | |
| 6,122,051 A | 9/2000 | Ansley et al. | |
| 6,177,994 B1 | 1/2001 | Watson et al. | |
| 6,417,916 B1 | 7/2002 | Dengler et al. | |
| 6,429,930 B1 | 8/2002 | Littau et al. | |
| 6,429,943 B1 | 8/2002 | Opsal et al. | |
| 6,449,037 B2 | 9/2002 | Jun et al. | |
| 6,515,744 B2 | 2/2003 | Wei | |
| 6,532,076 B1 | 3/2003 | Sidorowich | |
| 6,606,152 B2 | 8/2003 | Littau et al. | |
| 6,608,690 B2 | 8/2003 | Niu et al. | |
| 6,654,131 B2 | 11/2003 | Opsal et al. | |
| 6,699,624 B2 | 3/2004 | Niu et al. | |
| 6,704,661 B1 | 3/2004 | Opsal et al. | |
| 6,710,876 B1 * | 3/2004 | Nikoonahad et al. | 356/401 |
| 6,721,691 B2 | 4/2004 | Bao et al. | |
| 6,738,138 B2 | 5/2004 | Wei | |
| 6,750,968 B2 | 6/2004 | Sandusky | |
| 6,753,961 B1 | 6/2004 | Norton et al. | |
| 6,762,111 B2 | 7/2004 | Fukuda | |
| 6,768,983 B1 | 7/2004 | Jakatdar et al. | |
| 6,772,084 B2 | 8/2004 | Bischoff et al. | |
| 6,775,015 B2 | 8/2004 | Bischoff et al. | |
| 6,778,911 B2 | 8/2004 | Opsal et al. | |
| 6,781,706 B2 | 8/2004 | Sidorowich | |
| 6,785,638 B2 | 8/2004 | Niu et al. | |
| 6,791,679 B2 | 9/2004 | Engelhard et al. | |
| 6,804,005 B2 | 10/2004 | Bischoff et al. | |
| 6,813,034 B2 | 11/2004 | Rosencwaig et al. | |
| 6,819,426 B2 | 11/2004 | Sezginer et al. | |
| 6,829,057 B2 | 12/2004 | Opsal et al. | |
| 6,842,259 B2 | 1/2005 | Rosencwaig et al. | |
| 6,856,408 B2 | 2/2005 | Raymond | |
| 6,866,153 B2 | 3/2005 | Turner, Jr. et al. | |
| 6,870,621 B2 | 3/2005 | Wei | |
| 6,885,464 B1 | 4/2005 | Pfeiffer et al. | |
| 6,886,153 B1 | 4/2005 | Bevis | |
| 6,919,964 B2 | 7/2005 | Chu | |
| 6,921,916 B2 | 7/2005 | Adel et al. | |
| 6,928,628 B2 | 8/2005 | Seligson et al. | |
| 6,931,361 B2 | 8/2005 | Opsal et al. | |
| 6,947,850 B2 | 9/2005 | Opsal et al. | |
| 6,949,462 B1 | 9/2005 | Yang et al. | |
| 6,952,261 B2 | 10/2005 | Ebert | |
| 6,972,852 B2 | 12/2005 | Opsal et al. | |
| 6,974,962 B2 | 12/2005 | Brill et al. | |
| 6,982,793 B1 | 1/2006 | Yang et al. | |
| 6,985,229 B2 * | 1/2006 | Lee et al. | 356/401 |
| 6,987,572 B2 | 1/2006 | Lakkapragada et al. | |
| 6,992,764 B1 | 1/2006 | Yang et al. | |
| 7,046,376 B2 | 5/2006 | Sezginer | |
| 7,061,615 B1 | 6/2006 | Lowe-Webb | |
| 7,061,622 B2 | 6/2006 | Rollins et al. | |
| 7,061,623 B2 | 6/2006 | Davidson | |
| 7,061,627 B2 | 6/2006 | Opsal et al. | |
| 7,068,363 B2 | 6/2006 | Bevis et al. | |
| 7,080,330 B1 | 7/2006 | Choo et al. | |
| 7,089,164 B2 | 8/2006 | Middlebrooks | |
| 7,112,813 B2 | 9/2006 | Den Boef et al. | |
| 7,115,858 B1 | 10/2006 | Holden et al. | |
| 7,139,081 B2 | 11/2006 | De Groot | |
| 7,148,959 B2 | 12/2006 | Dusa et al. | |
| 7,215,431 B2 | 5/2007 | Opsal | |
| 7,224,456 B1 | 5/2007 | Phan et al. | |
| 7,230,703 B2 | 6/2007 | Sezginer et al. | |
| 7,236,244 B1 | 6/2007 | Yang et al. | |
| 7,265,850 B2 | 9/2007 | Archie et al. | |
| 7,277,172 B2 | 10/2007 | Kandel et al. | |
| 7,280,212 B2 | 10/2007 | Mieher et al. | |
| 7,292,341 B2 | 11/2007 | Brill et al. | |
| 7,298,481 B2 | 11/2007 | Mieher et al. | |
| 7,301,649 B2 | 11/2007 | Fabrikant et al. | |
| 7,317,531 B2 | 1/2008 | Mieher et al. | |
| 7,333,200 B2 | 2/2008 | Sezginer et al. | |
| 7,365,858 B2 | 4/2008 | Fang-Yen et al. | |
| 7,440,105 B2 | 10/2008 | Adel et al. | |
| 7,483,133 B2 | 1/2009 | Bareket et al. | |
| 7,532,305 B2 * | 5/2009 | Den Boef et al. | 355/52 |
| 7,532,317 B2 | 5/2009 | Smith et al. | |
| 7,564,555 B2 * | 7/2009 | Den Boef et al. | 356/401 |
| 7,791,727 B2 | 9/2010 | Den Boef et al. | |
| 7,791,732 B2 | 9/2010 | Den Boef et al. | |
| 7,869,057 B2 | 1/2011 | De Groot | |
| 2002/0018217 A1 | 2/2002 | Weber-Grabau et al. | |
| 2002/0165636 A1 | 11/2002 | Hasan | |
| 2002/0166982 A1 | 11/2002 | Kataoka et al. | |
| 2002/0192577 A1 | 12/2002 | Fay et al. | |
| 2003/0002043 A1 | 1/2003 | Abdulhalim et al. | |
| 2003/0081216 A1 | 5/2003 | Ebert et al. | |
| 2003/0133102 A1 | 7/2003 | Opsal | |
| 2003/0143761 A1 | 7/2003 | Fukuda | |
| 2003/0163295 A1 | 8/2003 | Jakatdar et al. | |
| 2003/0225535 A1 | 12/2003 | Doddi et al. | |
| 2004/0004726 A1 | 1/2004 | Sezginer et al. | |
| 2004/0017574 A1 | 1/2004 | Vuong et al. | |
| 2004/0066517 A1 | 4/2004 | Huang et al. | |
| 2004/0070772 A1 | 4/2004 | Shchegrov et al. | |
| 2004/0078173 A1 | 4/2004 | Bischoff et al. | |
| 2004/0119970 A1 | 6/2004 | Dusa et al. | |
| 2004/0129900 A1 * | 7/2004 | Den Boef et al. | 250/559.3 |
| 2004/0133362 A1 | 7/2004 | Barouch et al. | |
| 2004/0167754 A1 | 8/2004 | Bischoff et al. | |
| 2004/0181768 A1 | 9/2004 | Krukar | |
| 2004/0189993 A1 | 9/2004 | Ebert | |
| 2004/0190008 A1 | 9/2004 | Mieher et al. | |
| 2004/0196460 A1 | 10/2004 | Dobschal et al. | |
| 2004/0201836 A1 | 10/2004 | Chang et al. | |
| 2004/0223137 A1 | 11/2004 | Littau et al. | |
| 2004/0239954 A1 | 12/2004 | Bischoff | |
| 2004/0246476 A1 | 12/2004 | Bevis et al. | |
| 2005/0012928 A1 | 1/2005 | Sezginer et al. | |
| 2005/0041258 A1 | 2/2005 | Opsal et al. | |
| 2005/0046855 A1 | 3/2005 | Davidson | |
| 2005/0106479 A1 | 5/2005 | Geh et al. | |
| 2005/0122516 A1 | 6/2005 | Sezginer et al. | |
| 2005/0123844 A1 | 6/2005 | Monshouwer | |
| 2005/0195412 A1 | 9/2005 | Opsal | |
| 2005/0209816 A1 | 9/2005 | Vuong et al. | |
| 2006/0007446 A1 | 1/2006 | Boef et al. | |
| 2006/0033921 A1 | 2/2006 | Den Boef et al. | |
| 2006/0066855 A1 | 3/2006 | Den Boef et al. | |
| 2006/0082792 A1 | 4/2006 | Sezginer | |
| 2006/0117293 A1 | 6/2006 | Smith et al. | |
| 2006/0126074 A1 * | 6/2006 | Van Der Werf et al. | 356/489 |
| 2006/0139592 A1 | 6/2006 | Den Boef et al. | |
| 2006/0243912 A1 | 11/2006 | Raymond et al. | |
| 2006/0250597 A1 | 11/2006 | Nakajima | |
| 2007/0019171 A1 | 1/2007 | Smith | |
| 2008/0036984 A1 | 2/2008 | Mos et al. | |
| 2008/0043239 A1 | 2/2008 | Boef et al. | |
| 2008/0074666 A1 | 3/2008 | Boef et al. | |
| 2008/0144036 A1 | 6/2008 | Van Der Schaar | |
| 2008/0158564 A1 | 7/2008 | Archie et al. | |
| 2008/0239318 A1 | 10/2008 | Boef et al. | |
| 2008/0311344 A1 | 12/2008 | Marie Kiers et al. | |
| 2011/0007314 A1 | 1/2011 | Den Boef et al. | |

FOREIGN PATENT DOCUMENTS

| | | |
|---|---|---|
| EP | 0 882 976 A1 | 12/1998 |
| EP | 0 973 069 A2 | 1/2000 |
| EP | 1 400 855 A2 | 3/2004 |
| JP | 01-303721 A | 12/1989 |
| JP | 2000-097841 A | 4/2000 |
| JP | 2003-224057 A | 8/2003 |
| JP | 2004-287400 A | 10/2004 |
| JP | 2006-060214 A | 3/2006 |
| JP | 2006-157023 A | 6/2006 |
| JP | 2006-226994 A | 8/2006 |

| | | | |
|---|---|---|---|
| JP | 2006-518942 A | 8/2006 | |
| JP | 2007-527531 A | 9/2007 | |
| JP | 2008-542790 A | 11/2008 | |
| WO | WO 95/02814 A1 | 1/1995 | |
| WO | WO 03/065119 A2 | 8/2003 | |
| WO | WO 03/075042 A2 | 9/2003 | |
| WO | WO 2004/024328 A1 | 3/2004 | |
| WO | WO 2004/053426 A1 | 6/2004 | |
| WO | WO 2004/107415 A1 | 12/2004 | |
| WO | WO 2005/028992 A2 | 3/2005 | |
| WO | WO 2005/069082 A1 | 7/2005 | |

OTHER PUBLICATIONS

Second Non-Final Rejection mailed Sep. 11, 2007 for related U.S. Appl. No. 10/918,742 (now U.S. Patent No. 7,791,727), filed Aug. 16, 2004; 24 pages.

Final Rejection mailed Jun. 16, 2008 for U.S. Appl. No. 10/918,742 (now U.S. Patent No. 7,791,727), filed Aug. 16, 2004; 27 pages.

Third Non-Final Rejection mailed Nov. 10, 2008 for U.S. Appl. No. 10/918,742 (now U.S. Patent No. 7,791,727), filed Aug. 16, 2004; 18 pages.

Second Final Rejection mailed Apr. 29, 2009 for U.S. Appl. No. 10/918,742 (now U.S. Patent No. 7,791,727), filed Aug. 16, 2004; 14 pages.

Non-Final Rejection mailed Oct. 1, 2009 for U.S. Appl. No. 10/918,742 (now U.S. Patent No. 7,791,727), filed Aug. 16, 2004; 6 pages.

Notice of Allowance dated Jun. 11, 2010, directed to related U.S. Appl. No. 10/918,742 (now U.S. Patent No. 7,791,727), filed Aug. 16, 2004; 6 pages.

Non-Final Rejection mailed Jun. 20, 2008 for U.S. Appl. No. 11/203,418 (now U.S. Patent No. 7,791,732), filed Aug. 15, 2005; 22 pages.

Final Rejection mailed Apr. 15, 2009 for U.S. Appl. No. 11/203,418 (now U.S. Patent No. 7,791,732), filed Aug. 15, 2005; 13 pages.

Non-Final Rejection mailed Sep. 2, 2009 for U.S. Appl. No. 11/203,418 (now U.S. Patent No. 7,791,732), filed Aug. 15, 2005; 14 pages.

Notice of Allowance mailed Jun. 24, 2010 for U.S. Appl. No. 11/203,418 (now U.S. Patent No. 7,791,732), filed Aug. 15, 2005; 6 pages.

Non-Final Rejection mailed Jun. 12, 2008, directed to co-pending U.S. Appl. No. 11/641,124, filed Dec. 19, 2006; 19 pages.

Final Rejection mailed Mar. 16, 2009, directed to co-pending U.S. Appl. No. 11/641,124 filed Dec. 19, 2006; 22 pages.

Non-Final Rejection mailed Jul. 21, 2009, directed to co-pending U.S. Appl. No. 11/641,124 filed Dec. 19, 2006; 23 pages.

Final Rejection mailed Jan. 29, 2010, directed to co-pending U.S. Appl. No. 11/641,124 filed Dec. 19, 2006; 26 pages.

English language abstract for JP 01-303721 A, published Dec. 7, 1989; 1 page.

English language abstract for JP 2000-097841 A, published Apr. 7, 2000; 1 page.

English language abstract for JP 2003-224057 A, published Aug. 8, 2003; 1 page.

Notice of Reasons for Rejection directed to Japanese Patent Application No. 2005-235188, mailed Mar. 3, 2009; 4 pages.

European Search Report issued for European Patent Application No. 05254994.6, dated Dec. 9, 2005; 4 pages.

European Search Report issued for European Patent Application No. 05254994.6-2222, dated Feb. 23, 2006; 11 pages.

"Interferometric Method of Checking the Overlay Accuracy in Photolithographic Exposure Processes," *IBM Technical Disclosure Bulletin* 32:10B:214-217, IBM Corp. (Mar. 1990).

"Inteferometric Measurement System for Overlay Measurement in Lithographic Processes," *IBM Technical Disclosure Bulletin* 37:02B:535-536, IBM Corp. (Feb. 1994).

J. Bischoff et al., "Light Diffraction Based Overlay Measurement", *Metrology, Inspection, and Process Control for Microlithography XV 4344*:222-223, Proceedings of SPIE (2001).

Krukar, R., Overlay and Grating Line Shape Metrology Using Optical Scatterometry: Final Report, Defense Advanced Research Projects Agency (DOD), ARPA Order No. 5916; 40 pages.

English Language Abstract for JP 2004-287400 A, published Oct. 14, 2004; 1 page.

English Language Abstract for JP 2006-060214 A, published Mar. 2, 2006; 1 page.

English Language Abstract for JP 2006-157023 A, published Jun. 15, 2006; 1 page.

English Language Abstract for JP 2006-226994 A, published Aug. 31, 2006; 2 pages.

English Language Translation of Notice of Reasons for Rejection directed to related Japanese Patent Application No. 2007-320546, mailed on Jan. 14, 2011, from the Japanese Patent Office; 3 pages.

Non Final U.S. Office Action directed to co-pending U.S. Appl. No. 12/805,852, filed Aug. 20, 2010, mailed Feb. 24, 2011; 23 pages.

Notice of Allowance directed to co-pending U.S. Appl. No. 12/805,852, filed Aug. 20, 2010, mailed Jun. 15, 2011; 7 pages.

Notice of Allowance mailed Aug. 4, 2011, directed to related U.S. Appl. No. 12/805,852, filed Aug. 20, 2010; 7 pages.

Naqvi, S.S.H., et al., "Diffractive techniques for lithographic process monitoring and control," *J. Vac. Sci. Technol. B 12*(6):3600-3606, American Vacuum Society (1994).

Zaidi, S.H., et al., "Moiré interferometric alignment and overlay techniques," *SPIE 2196*:371-381, Center for High Technology Materials, University of New Mexico (1994).

* cited by examiner

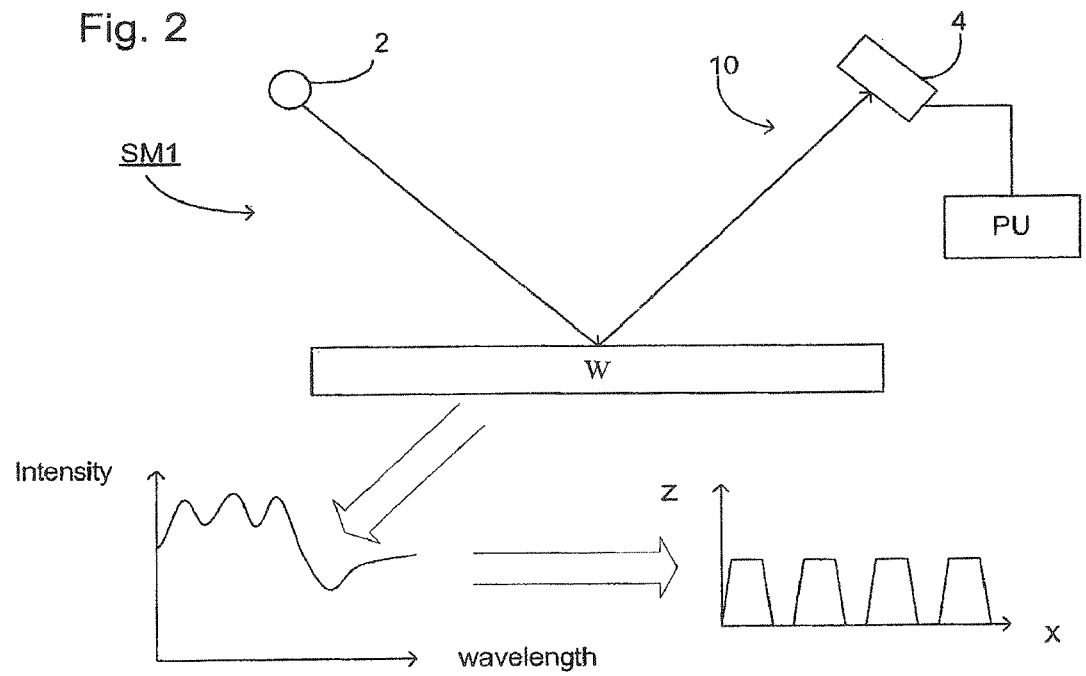
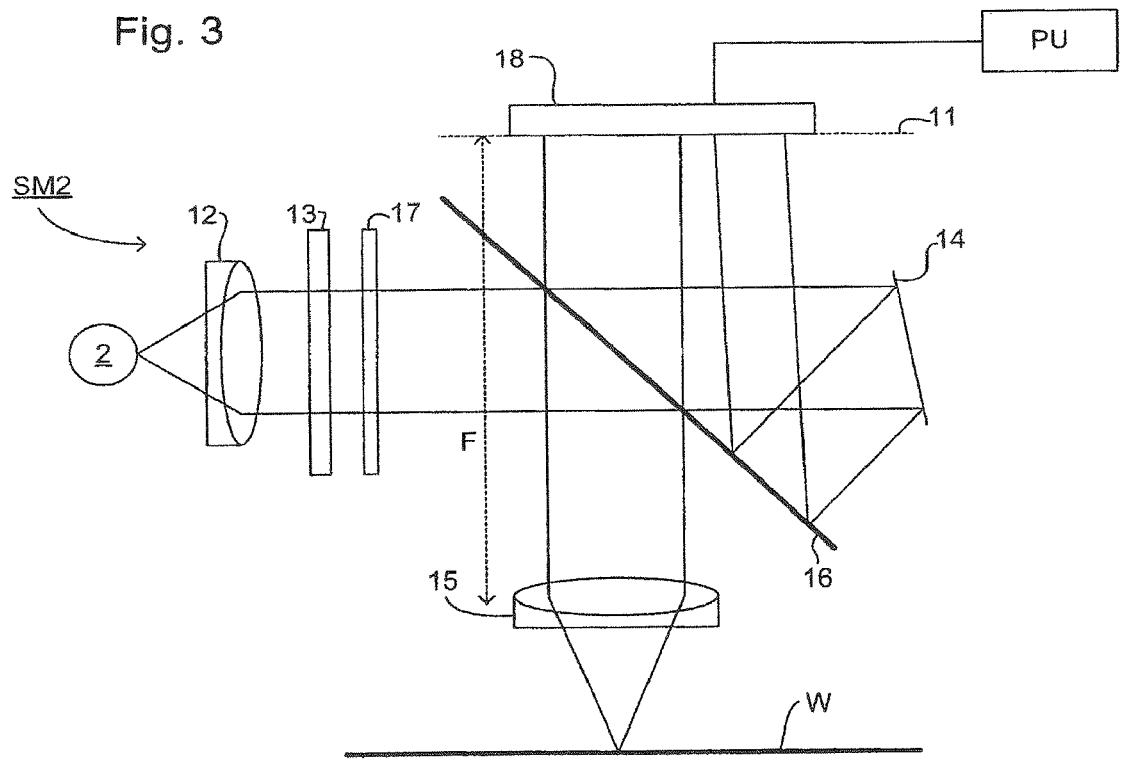

METHOD OF MEASUREMENT, AN INSPECTION APPARATUS AND A LITHOGRAPHIC APPARATUS

CROSS REFERENCE TO RELATED APPLICATIONS

This application is a continuation of U.S. application Ser. No. 11/641,124, filed Dec. 19, 2006 (now abandoned), which is incorporated herein by reference in its entirety. This application is also a continuation-in-part of U.S. application Ser. Nos. 10/918,742, filed Aug. 16, 2004 (now U.S. Pat. No. 7,791,727), and Ser. No. 11/203,418 (now U.S. Pat. No. 7,791,732), filed Aug. 15, 2005, which are incorporated herein by reference in their entireties.

BACKGROUND

1. Field of the Invention

The present invention relates to methods of inspection usable, for example, in the manufacture of devices by lithographic techniques and to methods of manufacturing devices using lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"–direction) while synchronously scanning the substrate parallel or anti-parallel to this direction. It is also possible to transfer the pattern from the patterning device to the substrate by imprinting the pattern onto the substrate.

In order to monitor the lithographic process, one or more parameters of the patterned substrate are typically measured, for example the overlay error between successive layers formed in or on the substrate. There are various techniques for making measurements of the microscopic structures formed in a lithographic process, including the use of a scanning electron microscope and various specialized tools. One form of specialized inspection tool is a scatterometer in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with data stored in a library of known measurements associated with a known substrate property. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle. An ellipsometer measures polarization state.

SUMMARY

It is desirable, for example, to provide an improved method of detecting the overlay error.

According to an aspect of the present invention, there is provided a method of measuring an overlay error in a substrate, the method comprising projecting a beam of radiation onto a target on the substrate, the target comprising a first periodic pattern arranged on a first layer and a second periodic pattern arranged on a second layer, the second periodic pattern having a known bias of +d with respect to the first pattern and having a period different than a period of the first periodic pattern, measuring radiation redirected from the substrate using a scatterometer, and determining an extent of the overlay error from the redirected radiation.

According to a further aspect of the present invention, there is provided an inspection apparatus configured to measure a property of a substrate, the apparatus comprising a source of radiation, a detector, and a processor. The source is configured to direct radiation onto the substrate. The detector is configured to detect radiation redirected from the substrate, The processor is configured to calculate an overlay error on the basis of the redirected radiation from a plurality of overlapping patterns, at least two patterns of the overlapping patterns having different periods.

BRIEF DESCRIPTION OF THE DRAWINGS/FIGURES

Embodiments of the invention will now be described, by way of example only, with reference to the accompanying schematic drawings in which corresponding reference symbols indicate corresponding parts.

Figure 1B:
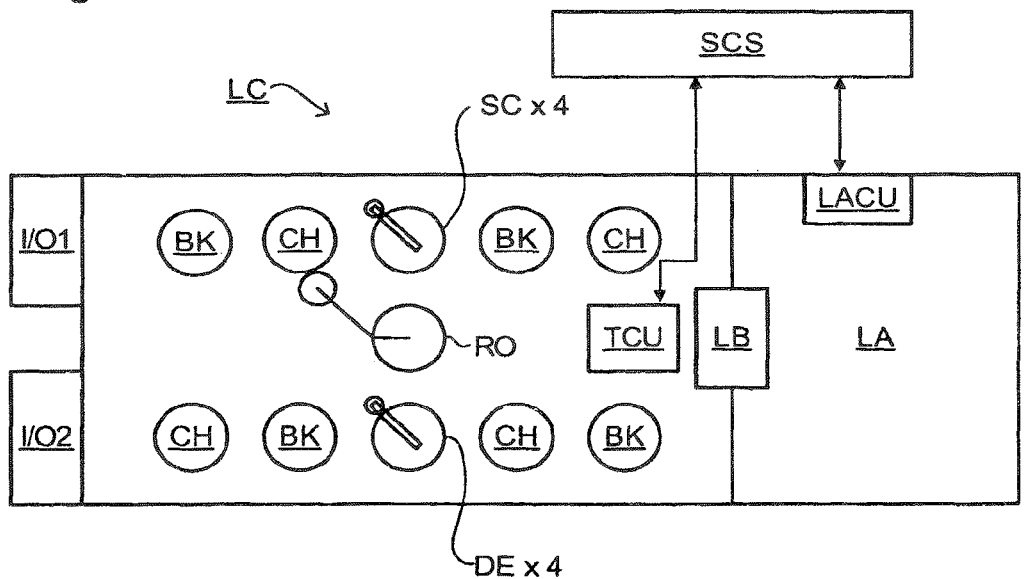
Figure 4A:
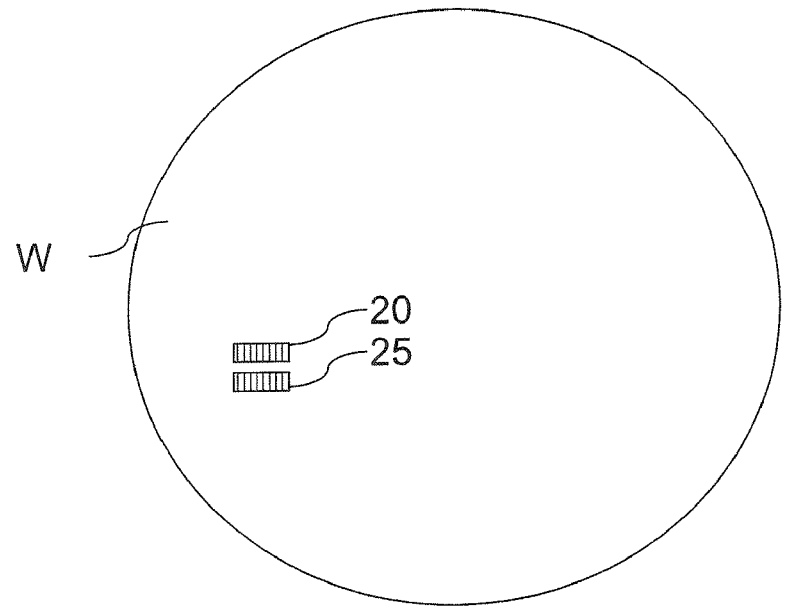
Figure 4B:
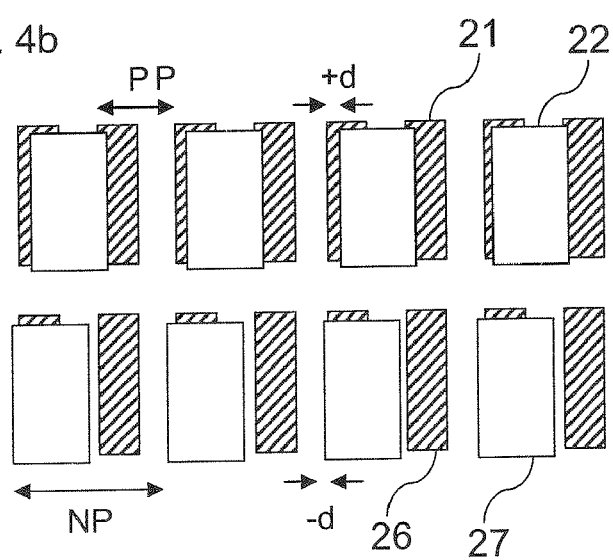
Figure 5A:
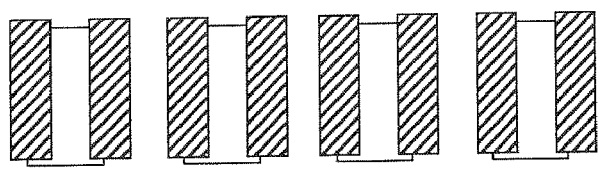
Figure 5B:
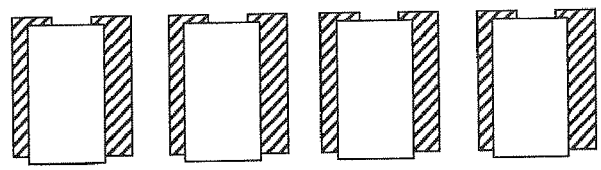

FIG. 1a depicts a lithographic apparatus.
FIG. 1b depicts a lithographic cell or cluster.
FIG. 2 depicts a first scatterometer.
FIG. 3 depicts a second scatterometer.
FIGS. 4a and 4b depict patterns on a substrate, according to an embodiment of the invention.
FIGS. 5a and 5b depict patterns on a substrate.

DETAILED DESCRIPTION

FIG. 1a schematically depicts a lithographic apparatus. The apparatus comprises an illumination system (illuminator) IL configured to condition a radiation beam B (e.g. UV radiation or EUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and -a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted minors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structure while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A system of illuminating a target and collecting data from the reflected radiation is often used on a plurality of superimposed patterns, for example a plurality of gratings. In an embodiment, the second grating has a certain bias compared to the first grating. By analyzing the characteristics of the reflected radiation, it is possible to determine the overlay error, OV, between the gratings. This is achieved by introducing a known bias, d, between gratings in different layers. An example of such an arrangement and system is described in U.S. patent application Ser. No. 11/504,106, now U.S. Pat. No. 7,564,555, which is incorporated herein in its entirety by reference.

As shown in FIG. 1b, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked—to improve yield— or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

FIG. 2 depicts a scatterometer SM1 which may be used in an embodiment of the invention. It comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer SM2 that may be used with an embodiment of the invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filters may be tunable rather than comprising a set of different filters. A grating could be used instead of or in addition to one or more interference filters.

The detector 18 may measure the intensity of scattered light at a single wavelength (or narrow wavelength range), the intensity separately at multiple wavelengths or the intensity integrated over a wavelength range. Further, the detector may separately measure the intensity of transverse magnetic— (TM) and transverse electric—(TE) polarized radiation and/ or the phase difference between the transverse magnetic— and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail, e.g., in U.S. Patent Application Publication No. 2006-0066855, which document is hereby incorporated in its entirety by reference.

The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit, from knowledge of the printing step and/or other scatterometry processes.

As shown in FIG. 4*a*, the substrate W may comprise a plurality of patterns 20, 25. The patterns may be printed such that after development, the bars are formed of solid resist lines or may be etched into the substrate using a lithographic apparatus. Alternatively, the patterns may be in the earlier processed layer, either etched into the substrate or embedded in a metal layer. The superimposed patterns are generally separated in a vertical direction.

FIG. 4*b* is larger scale version of the patterns depicted in FIG. 4*a*. During a first exposure step in a lithographic process, a first set of gratings 21, 26 having a period P are etched into the substrate. During a second exposure step in a lithographic process a second set of gratings 22, 27 having a period NP are etched into the substrate, where N is an integer greater than 2. In the illustrated embodiment N=2 although it need not be limited to this. The second set of gratings are desirably vertically separated (i.e., perpendicular to the substrate surface in a different process layer) from the first set of gratings. The first grating 22 of the second set of gratings overlaps with the first grating 21 of the first set of gratings and has a known offset +d. The total overlay in this set up is therefore $X_1$=Ovid. The second grating 27 of the second set of gratings overlaps with the second grating 26 of the first set of gratings and has a known offset −d. The total overlay in this set up is therefore $X_2$=OV−d. So for $X_1$ the asymmetry is given by $$A_+ = K(OV+d)$$

and for $X_2$ the asymmetry is given by:

$$A_- = K(OV-d)$$

where K is a scaling factor.

The scaling factor can be eliminated to determine the overlay error:

$$OV = dA_+ + A_- A_+ - A_- OV = d\frac{A_+ + A_-}{A_+ - A_-}$$

The overlay error (which usually represents the overlay error between different layers of processing) can therefore be calculated using the angle resolved scatter spectrum. Indeed any of the diffraction orders can be used in this calculation.

Although in the example described above the grating with the larger period is on top of the grating with the smaller period, the grating with the smaller period could equally be on top of the grating with the larger period, as shown in FIGS. 5*a* and 5*b*.

An embodiment of this invention has been described with reference to an ID grating but a 2D grating could equally well be used and the overlay error in two directions thus calculated.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general tennis "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams;

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the foam of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring an overlay error on a substrate, the method comprising:
    projecting a beam of radiation onto a target on the substrate, the target comprising a first periodic pattern arranged on a first layer of the substrate and a second periodic pattern arranged on a second layer of the substrate, the second periodic pattern having a known bias of +d with respect to the first pattern and having a period different than a period of the first periodic pattern;
    measuring, using a scatterometer, an asymmetry between intensities of non-zero diffraction order radiation beams redirected from the substrate; and
    reconstructing a target pattern based on parameters of the target pattern, wherein the target pattern is based on parameters of an exposure tool.

2. The method of claim 1, wherein the first periodic pattern has a periodicity of P and the second periodic pattern has a periodicity of NP where N is an integer $\geq 2$.

3. The method of claim 1, wherein the beam is linearly polarized.

4. The method of claim 1, wherein the first periodic pattern comprises a grating.

5. The method of claim 1, further comprising:
    projecting a beam of radiation onto a second target on the substrate, the second target comprising a third periodic pattern arranged on the first layer of the substrate and a fourth periodic pattern arranged on the second layer of the substrate, the fourth periodic pattern having a known bias of −d with respect to the third periodic pattern and having a period different than a period of the third periodic pattern;
    measuring, using a scatterometer, another asymmetry between intensities of non-zero diffraction order radiation beams redirected from the second target; and
    determining an extent of the overlay error from the asymmetries.

6. The method of claim 4, wherein the second periodic pattern comprises a grating.

7. The method of claim 5, wherein the third periodic pattern has a periodicity of P and the fourth periodic pattern has a periodicity of NP where N is an integer $\geq 2$.

8. A method of manufacturing a substrate, comprising:
    projecting a beam of radiation onto a target on the substrate, the target comprising a first periodic pattern arranged on a first layer of the substrate and a second periodic pattern arranged on a second layer of the substrate, the second periodic pattern having a known bias of +d with respect to the first periodic pattern and having a period different than a period of the first periodic pattern;
    measuring, using a scatterometer, an asymmetry between intensities of non-zero diffraction order radiation beams redirected from the substrate;
    projecting a patterned beam of radiation onto the substrate to expose the substrate based on a determined overlay error; and
    reconstructing a target based on parameters of the target pattern, wherein the target pattern is based on parameters of an exposure tool.

9. The method of claim 8, wherein the first periodic pattern has a periodicity of P and the second periodic pattern has a periodicity of NP where N is an integer $\geq 2$.

10. The method of claim 8, further comprising:
    projecting a beam of radiation onto a second target on the substrate, the second target comprising a third periodic pattern arranged on the first layer of the substrate and a fourth periodic pattern arranged on the second layer of the substrate, the fourth periodic pattern having a known bias of −d with respect to the third periodic pattern and having a period different than a period of the third periodic pattern;
    measuring, using a scatterometer, another asymmetry between intensities of non-zero diffraction order radiation beams redirected from the second target;
    determining an extent of the overlay error from the asymmetries.

11. The method of claim 10, wherein the third periodic pattern has a periodicity of P and the fourth periodic pattern has a periodicity of NP where N is an integer $\geq 2$.

12. An inspection apparatus, comprising:
    a source of radiation configured to direct radiation onto a substrate;
    a detector configured to detect an asymmetry between intensities of non-zero diffraction order radiation beams redirected from the substrate by a plurality of overlapping patterns, at least two patterns of the overlapping patterns having different periods; and a processing unit configured to calculate an overlay error on the basis of the asymmetry between intensities and reconstruct a target pattern based on parameters of the target pattern.

13. The inspection apparatus of claim 12, wherein one of the at least two patterns has a periodicity of P and another of the at least two patterns has a periodicity of NP where N is an integer $\geq 2$.

14. The inspection apparatus of claim 12, wherein the processing unit is further configured to calculate the overlay error on the basis of another asymmetry between intensities of non-zero diffraction order radiation beams redirected from a further plurality of overlapping patterns, at least two patterns of the further plurality of overlapping patterns having different periods.

15. The inspection apparatus of claim 12, wherein one of the at least two patterns has a known bias of +d with respect to another of the at least two patterns.

16. The inspection apparatus of claim 15, wherein:
the processing unit is further configured to calculate the overlay error on the basis of another asymmetry between intensities of non-zero diffraction order radiation beams redirected from a further plurality of overlapping patterns;
at least two patterns of the further plurality of overlapping patterns having different periods; and
one of the at least two patterns of the further plurality of overlapping patterns has a known bias of −d with respect to another of the at least two patterns of the further plurality of overlapping patterns.

17. A lithographic apparatus, comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
a detector configured to detect an asymmetry between intensities of non-zero diffraction order radiation beams redirected from the substrate by a plurality of overlapping patterns, at least two patterns of the plurality of overlapping patterns having different periods; and
a processing unit configured to calculate an overlay error on the basis of the asymmetry between intensities and to reconstruct a target pattern based on parameters of the target pattern.

18. The lithographic apparatus of claim 17, wherein one of the at least two patterns has a periodicity of P and another of the at least two patterns has a periodicity of NP where N is an integer $\geq 2$.

19. The lithographic apparatus of claim 17, wherein the processing unit is further configured to calculate the overlay error on the basis of another asymmetry between intensities of non-zero diffraction order radiation beams redirected from a further plurality of overlapping patterns, at least two patterns of the further plurality of overlapping patterns having different periods.

20. The lithographic apparatus of claim 17, wherein one of the at least two patterns has a known bias of +d with respect to another of the at least two patterns.

21. The lithographic apparatus of claim 20, wherein the processing unit is further configured to calculate the overlay error on the basis of another asymmetry between intensities of non-zero diffraction order radiation beams redirected from a further plurality of overlapping patterns, at least two patterns of the further plurality of overlapping patterns having different periods and wherein one of the at least two patterns of the further plurality of overlapping patterns has a known bias of −d with respect to another of the at least two patterns of the further plurality of overlapping patterns.

* * * * *